US008547158B2

(12) United States Patent
Pfeiffer et al.

(10) Patent No.: US 8,547,158 B2
(45) Date of Patent: Oct. 1, 2013

(54) DISTRIBUTIVE RESISTIVE MIXER

(75) Inventors: Ullrich Pfeiffer, Wuppertal (DE); Erik Oejefors, Wuppertal (DE); Hartmut G. Roskos, Kronberg (DE); Alvydas Lisauskas, Frankfurt (DE)

(73) Assignee: Johann Wolfgang Goeth-Universität Frankfurt a.M. (DE)

( * ) Notice: Subject to any disclaimer, the term of this patent is extended or adjusted under 35 U.S.C. 154(b) by 7 days.

(21) Appl. No.: 13/063,001

(22) PCT Filed: Aug. 28, 2009

(86) PCT No.: PCT/EP2009/061169
§ 371 (c)(1),
(2), (4) Date: May 13, 2011

(87) PCT Pub. No.: WO2010/028966
PCT Pub. Date: Mar. 18, 2010

(65) Prior Publication Data
US 2011/0254610 A1    Oct. 20, 2011

(30) Foreign Application Priority Data

Sep. 12, 2008  (DE) .......................... 10 2008 047 101

(51) Int. Cl.
*G06G 7/12* (2006.01)

(52) U.S. Cl.
USPC ............................ 327/356; 327/355; 455/323

(58) Field of Classification Search
USPC ............. 327/355–361; 455/323, 326
See application file for complete search history.

(56) References Cited

U.S. PATENT DOCUMENTS

| | | | |
|---|---|---|---|
| 4,647,848 A | 3/1987 | Barrett | |
| 4,675,911 A | 6/1987 | Sokolov et al. | |
| 4,709,410 A * | 11/1987 | Tajima et al. | 455/333 |
| 4,751,744 A * | 6/1988 | Pavio, Jr. | 455/333 |
| 5,136,720 A * | 8/1992 | Titus et al. | 455/323 |
| 7,580,693 B2 * | 8/2009 | Rohde et al. | 455/326 |
| 7,643,808 B2 * | 1/2010 | Knopik | 455/189.1 |

* cited by examiner

FOREIGN PATENT DOCUMENTS

FR          2597680 A1   10/1987

OTHER PUBLICATIONS

Eric W. Lin and Walter H. Ku, "Device Considerations and Modeling for the Design of an InP-Based Modfet Millemeter-Wave Resistive Mixer With Superior Conversion Effeciency", IEEE Transactions on Microwave Thoery and Tecnique, vol. 43, No. 8, pp. 1951-1959, Aug. 8, 1995.

Primary Examiner — Dinh T. Le
(74) Attorney, Agent, or Firm — Paul & Paul

(57) ABSTRACT

The invention relates to devices comprising field effect transistors to detect the power of an electromagnetic high frequency signal $V_{RF}$. According to the prior art, the high frequency signal is coupled into the gate G and via a capacitor $C_{GD}$ into the drain D of the field effect transistor FET, the gate G being biased with a direct voltage $V_g$ which corresponds to the threshold value of the FET transistor. The resulting current at the source S contains a direct current portion $I_{ds}$ which is proportional to the square of the amplitude of the high frequency signal. The operating frequency of said power detectors is limited to a few gigahertz (GHz) by the discrete arrangement and especially by the predetermined gate length of the field effect transistor. The aim of the invention is to improve a resistive mixer in such a manner that it can be operated at high gigahertz and terahertz frequencies. For this purpose, the resistive mixer comprises a line which has a first and a second electrical conductor having respective connecting contacts so that an electrical high frequency signal can be coupled into the line, the first conductor having a plurality of series-connected voltage-dependent resistor elements (R) and at least one capacitive element (C) being interposed between the first and the second conductor.

13 Claims, 5 Drawing Sheets a) State of the art b)

DISTRIBUTIVE RESISTIVE MIXER

BACKGROUND OF THE INVENTION

The present invention concerns a resistive mixer for mixing or detecting an electrical or electromagnetic high frequency signal.

The terahertz frequency range or submillimeter wavelength range which is roughly defined as being between 100 gigahertz (GHz) and 10 terahertz (THz) is one of the last 'dark' areas in the electromagnetic spectrum. In that frequency range technically usable, in particular coherent sources and corresponding detectors are hitherto not commercially available or are commercially available only at low frequencies. The developments in the last decades have resulted in systems which by virtue of their complexity however are hitherto used only in experimentally distinguished areas such as radio astronomy or atmospheric research. Hitherto inexpensive sources and detectors are not available for applications in everyday life, that being although the THz frequency range has intrinsic advantages over other frequency bands in the electromagnetic spectrum:

- many optically opaque materials are transparent in the THz frequency range,
- THz radiation is non-ionising and is therefore deemed to be safe in the biomedical field,
- given rotatory, vibronic or libratory molecular excitations have a resonance frequency in the THz frequency range,
- THz radiation affords essential items of information about charge carrier dynamics, in particular in nanostructures, which play an essential part in future photonic and electronic components,
- THz radiation exhibits a lesser degree of scatter compared to optical frequencies and is therefore suitable in particular for use in industrial environments in which for example increased dust formation is involved, and
- if communication systems are considered higher frequencies permit greater transmission band widths.

Most purely electronic apparatuses operating in the THz frequency range are based on GaAs or InP semiconductor technology. It was shown in the end that SiGe and CMOS semiconductor technologies also result in apparatuses operating at up to 100 GHz. At higher frequencies up to 1 THz and above more complex quantum cascade laser systems are used equally as sources as optoelectronic systems based on femtosecond short pulse lasers or mixing of two continuous-wave laser sources.

At the present time the THz radiation is detected with heterodyne mixers, for example Schottky diode mixers, photoconductive detectors or power detectors such as for example photovoltaic detectors, bolometers or Golay cells.

All the above-described technologies however involve considerable complexity in the source and detector components themselves as well as the manufacture thereof so that although they are admittedly used in the field of research and development and in research-related fields of application such as radio astronomy, they are not suitable for mass markets.

Figure 1:
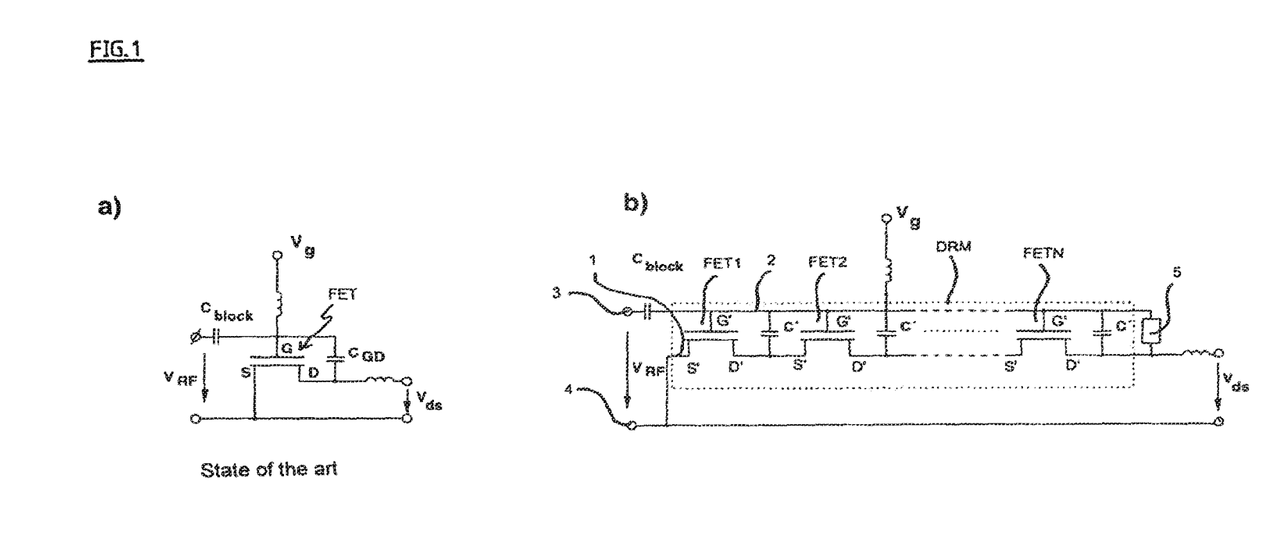
FIG. 1a) shows a resistive mixer according to the state of the art.
FIG. 1b) shows an equivalent circuit diagram of a resistive mixer according to an embodiment of the invention, FIG. 2 diagrammatically shows the structure of a further embodiment of the resistive mixer according to an embodiment of the invention, FIGS. 3A) and B) show the implementation of a voltage (A) and current output (B) at the drain of a mixer in accordance with an embodiment of the invention.

U.S. Pat. No. 4,647,848 discloses a field effect transistor circuit which is used as a discrete resistive mixer. The field effect transistor is used to detect the power level of an electromagnetic high frequency signal $V_{RF}$. A detector circuit from the state of the art is shown in FIG. 1a) of that application. The high frequency signal is coupled into the gate G and by way of a capacitor $C_{GD}$ into the drain D of the field effect transistor FET, wherein the gate G is biased with a dc voltage $V_G$ corresponding to the threshold value of the transistor FET. The resulting current at the source N then contains a dc component $I_{ds}$ which is proportional to the square of the amplitude of the high frequency signal. The output signal can be detected as a voltage $V_{ds}$ by way of a corresponding external resistor. In that respect the described receiver circuit is made up of discrete components. The output signal is filtered with a low pass filter to suppress the ac components.

In that respect the operating frequency of the power detector described in U.S. Pat. No. 4,647,848 is limited to a few gigahertz (GHz) by the discrete arrangement and in particular by the predetermined gate length of the field effect transistor.

In comparison the object of the present invention is to provide a resistive mixer which operates at high gigahertz and terahertz frequencies.

SUMMARY OF THE INVENTION

According to the invention that object is attained by a resistive mixer comprising a line which includes a first and a second electrical conductor having a respective connecting contact so that an electrical high frequency signal can be coupled into the line, wherein the first conductor has a plurality of series-connected voltage-dependent resistor elements (R), and wherein a capacitive element (C) is arranged between the first and second conductors.

The term resistive mixers in accordance with the present invention is used to denote both conventional resistive mixers in which modulation of the channel resistance is effected in the quasi-static limit case, and also plasmonic resistive mixers in which collective charge carrier oscillations (plasmons) are excited in the 2-dimensional electron gas. The plasmons can be weakly damped or overdamped.

The term electrical conductor in accordance with the present invention is used to denote an electrical connection which conducts the electrical current permanently, temporarily or under given environmental conditions. That embraces not just conventional conductors such as for example copper or other metals but in particular also semiconductors. In accordance with the invention the conductors can preferably have combinations of metallically conductive portions and semiconductor portions.

The line formed by the first and second conductors is a high frequency line, also referred to as a transmission line.

In that way in accordance with the invention there is provided an RC line with distributed voltage-dependent resistors and capacitors. The resistive mixer according to the present invention comprises a succession of series-connected elementary voltage-dependent resistor elements and parallel-connected capacitors which by virtue of their distributed arrangement respectively locally resistively mix a high frequency signal coupled on to the line and respectively already locally produce a direct current which is dependent on the power of the high frequency signal. Within the distributed resistive mixer the elementary voltage-dependent resistor elements achieve much better high frequency properties than for example the individual field effect transistor which is known from the state of the art and which is used for resistive mixing and whose gate length cannot be reduced as desired by virtue of the limitation of the available process technologies.

In an embodiment arranged between a first and a second voltage-dependent resistor element is a respective capacitive element between the first and second line for providing the complete RC line.

In a preferred embodiment of the invention the voltage-dependent resistor elements and the capacitive element are integrated in a single semiconductor element on a single substrate. In that way it is possible to implement not only reduced dimensions, in particular gate lengths in respect of the voltage-dependent resistor elements, but it is also possible to avoid parasitic capacitances as occur in arrangements with discrete components or reduce them to the edge regions of the line.

The term voltage-dependent resistor element in accordance with the present invention is used to denote an electrical resistor whose value depends on the voltage locally occurring at the resistor. In a preferred embodiment of the invention such a voltage-dependent resistor element is a field effect transistor, wherein for the mode of operation of the element the semiconductor technology with which the serial arrangement of the field effect transistors is implemented is not an important consideration. Examples of such implementations are silicon technology, CMOS technology, etc.

In an embodiment of the invention in which the voltage-dependent resistor elements are field effect transistors each having a source, a drain, a gate and a source-drain channel, the gates of all field effect transistors are so electrically connected together that the gates form the second conductor of the line, and wherein the drain of a first field effect transistor is connected to the source of a second field effect transistor so that the source, the source-drain channel and the drain of the first field effect transistor and the source, the source-drain channel and the drain of the second field effect transistor form the first conductor.

In a preferred embodiment of the invention the individual elementary field effect transistors which are connected in series as voltage-dependent resistor elements are embodied by the structuring of a common gate or a common source-drain channel respectively.

In such an embodiment, as clearly described, a discrete field effect transistor as is known for example as a JFET from the state of the art and whose effective gate length is determined by the spacing between the source and the drain is divided by suitable structuring of the metallic structure or the oxide layer of the gate or semiconductor structuring of the source-drain channel into an arrangement of interconnected elementary field effect transistors. Each individual one of the elementary field effect transistors, within the arrangement, has an effective gate length which is markedly reduced in comparison with the gate length of the original discrete, undivided field effect transistor.

In the case involving structuring of the gate, the metallisation of the gate is preferably in the form of a periodically repetitive structure. In an embodiment that structure is in the form of a grating.

The term semiconductor structuring in accordance with the present invention is used to denote a spatial structuring, in particular a spatially varying doping profile. In an embodiment such structuring of the doping profile is in the form of a periodically modulated doping of the source-drain channel in the vertical or longitudinal direction.

In a conventional field effect transistor the source and the drain cannot be taken just as close to each other as may be desired by virtue of the limitations in the process technology so that the source-drain spacing of a discrete field effect transistor cannot be less than 250 nm. In addition that source-drain spacing also limits the possible reduction in the effective gate length of a conventional field effect transistor.

In comparison with the arrangement according to the invention it is possible in particular to structure the gate with a level of resolution which is markedly below 250 nm on that the individual elementary field effect transistors formed by the structuring of the gate have much shorter effective gate lengths than the overall arrangement. If for example the gate of a field effect transistor with a gate length of 250 nm is structured in such a way that there are ten elementary field effect transistors according to the present invention then each of the elementary field effect transistors has only an effective gate length of less than 25 nm.

In an embodiment of the invention each of the elementary field effect transistors has an effective gate length or a length of the source-drain channel of less than 250 nm, preferably less than 200 nm.

In an embodiment of the arrangement according to the invention in which the series connection of the elementary field effect transistors is achieved by division of the source-drain channel of a conventional discrete field effect transistor either by structuring of the gate (structuring of the metallic structure and/or the oxide layer) or the source-drain channel, the implemented elementary field effect transistors do not have a source and a drain which are to be clearly separated from each other. Rather they are in the form of regions of the source-drain channel of the overall component which are defined by their function. In particular for example a region of the source-drain channel of the overall component which defines the drain of a first elementary field effect transistor at the same time also forms the source of a second field effect transistor.

It is desirable in that respect if the capacitive element or the plurality of capacitive elements of the RC line is also implemented by suitable structuring of the gate or the common source-drain channel. In that way the structuring not only implements the embodiment of the distributed field effect transistors in the overall arrangement, but also the parallel connection of the required capacitors.

In a further embodiment of the invention a series of arrangements which blend into each other is afforded by a structuring of the gate or the common source-drain channel instead of a discrete arrangement of series-connected distributed voltage-dependent resistor elements. That represents the limit case of an arrangement having a very large number of transistors (N tends towards infinity), wherein the effective gate length of the individual transistors becomes very short and tends towards zero. In particular such an arrangement can be achieved by the source-drain channel of the overall arrangement being provided with a ramp-shaped doping profile, wherein the doping of the source-drain channel continuously decreases or increases between the source and the drain.

In that respect, in the limit case of a further embodiment of the present invention, there are capacitor coatings and voltage-dependent resistor coatings, as are also formed within an electrically long FET channel. That limit case leads to the generation of plasma oscillations of a two-dimensional electron gas and thus a magnification of the mixer effect.

In that respect it is desirable if the second line is connected to a dc voltage source for biasing the gate of the field effect transistors. In that way in operation the gates of the distributed field effect transistors can be biased with a dc voltage in such a way that the threshold value of the transistors is reached.

As such biasing of the gates however causes leakage currents in particular in field effect transistors with thin gate oxides, an alternative embodiment provides that the field effect transistors are field effect transistors with a negligibly low threshold voltage, that is to say so-called zero-$V_T$ FETs. In that way leakage currents can be reduced even in the case of very thin gate oxide layers and the signal-noise ratio of the devices can be improved. The spectral sensitivity and band width of the component is further improved by the reduction in the thickness of the gate oxide layers.

In an embodiment of the invention the first and second conductors are connected at their ends in opposite relationship to the connecting contacts to an external matching network to increase the sensitivity of the arrangement. The external network permits phase matching between the gate voltage and an external RF drain voltage which is additionally coupled in.

In a further embodiment of the invention provided on the line, in addition to the resistor elements and the capacitive elements, are one or more diodes or other non-linear components in order further to increase mixer efficiency. In that respect the diode can be provided either in series with the voltage-dependent resistor elements on the first conductor or parallel to the capacitive element between the first and second conductors.

The resistive mixer element in accordance with the present invention has a wide area of use. In particular the resistive mixer element can be used as a detector for electromagnetic high frequency radiation in the THz frequency range. In such an embodiment it is desirable if the line is connected to an antenna element for high frequency radiation so that electromagnetic high frequency radiation received by the antenna in operation of the detector can be fed into the line.

To detect the power level of the high frequency radiation reaching the antenna element it is advantageous if the output of the line is connected to a charge coupled device (CCD). That charge coupled device (CCD) integrates the dc output of the mixer and the integrated signal is detected by way of a suitable electronic read-out arrangement.

In a further embodiment with an arrangement in line or matrix form of detector elements (camera, focal plane) the charge coupled device (CCD) is read out sequentially and erased after an integration time.

In an alternative embodiment the resistive mixer according to the invention is used as a mixer for mixing a high frequency signal in the THz frequency range with an electrical local oscillator signal. For that purpose a desirable embodiment of the detector is one in which the second conductor of the mixer in one of the above-described embodiments is connected to a local oscillator source.

BRIEF DESCRIPTION OF THE DRAWINGS

Further advantages, features and possible uses of the present invention will be apparent from the present description and the related Figures.

In the Figures described hereinafter identical elements or elements which perform a similar function are denoted by the same references.

DETAILED DESCRIPTION OF THE INVENTION

FIG. 1a) shows a resistive mixer as is known from the state of the art. It has already been described in the introductory part of this description.

FIG. 1b) shows an equivalent circuit diagram which schematically illustrates the structure of an embodiment of the resistive mixer according to the invention. In the illustrated embodiment of the mixer the elementary voltage-dependent resistor elements are implemented by a series of field effect transistors FET1, FET2, . . . FETN, wherein the three transistors shown by way of example stand for a large number of transistors, for example 20. Each of the field effect transistors FET has a source S, a drain D and a gate G. In the illustrated embodiment the field effect transistors are in the form of junction field effect transistors (JFETs). The field effect transistors are integrated into a high frequency line comprising a first conductor 1 and a second conductor 2. A high frequency signal $V_{RF}$ can be coupled into the high frequency line having the conductors 1, 2 by way of two connections 3, 4. The first conductor 1 of the high frequency line is formed by the source S' of the first field effect transistor FET1, the source-drain channel of the first field effect transistor FET1, the drain D' of the first field effect transistor FET1, a connection between the drain D' of the first field effect transistor FET1 and the source S' of the second field effect transistor FET2, the source S' of the second field effect transistor FET2, the source-drain channel of the second field effect transistor FET2, the drain D' of the second field effect transistor FET2 and so forth until it ends with the drain D' of the last field effect transistor FETN.

The second conductor 2 in contrast connects the gates G' of the individual field effect transistors FET1, FET2, . . . FETN or is afforded by a continuous structure forming the gates of the individual transistors. Arranged between the first conductor 1 and the second conductor 2 are capacitors C' arranged in parallel. In the illustrated embodiment the number of capacitors C' corresponds to the number of field effect transistors N. The first conductor 1 and the second conductor 2 are connected together by way of an external matching circuit 5 at the end of the line, that is to say at the drain of the last field effect transistor FETN, to adjust an external phase displacement and thus to be able to increase the sensitivity of the arrangement.

The mixer DRM (Distributed Resistive Mixer) shown in FIG. 1b) is an integrated component which is embodied on a single substrate.

Figure 2:
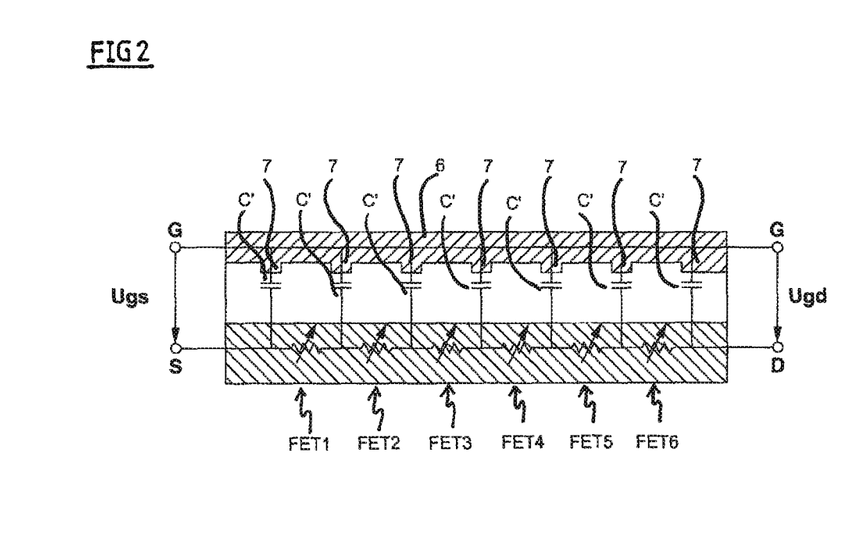

Such an integrated implementation of the distributed resistive mixer DRM is diagrammatically shown in FIG. 2. The structure firstly corresponds to a discrete field effect transistor having a gate G, a source S and a drain D of a gate length of about 250 nm. To be able to implement with that conventional field effect transistor an RC high frequency line having an arrangement of series-connected distributed field effect transistors, the field effect transistor is 'broken down' by the structuring of the gate G into individual elementary transistors FET1 through FET6. For that purpose the thickness of the gate oxide overall is reduced but has thickened portions 7. That periodic structuring provides that on the one hand there are elementary field effect transistors FET1 . . . FET6 connected in series, while on the other hand the thickened portions of the oxide layer 6 of the semiconductor component form the capacitors C'. In the context of an equivalent circuit diagram those capacitors C' and the voltage-dependent resistors of the individual field effect transistors FET1 through FET6 are illustrated in the semiconductor structure.

Figure 3:
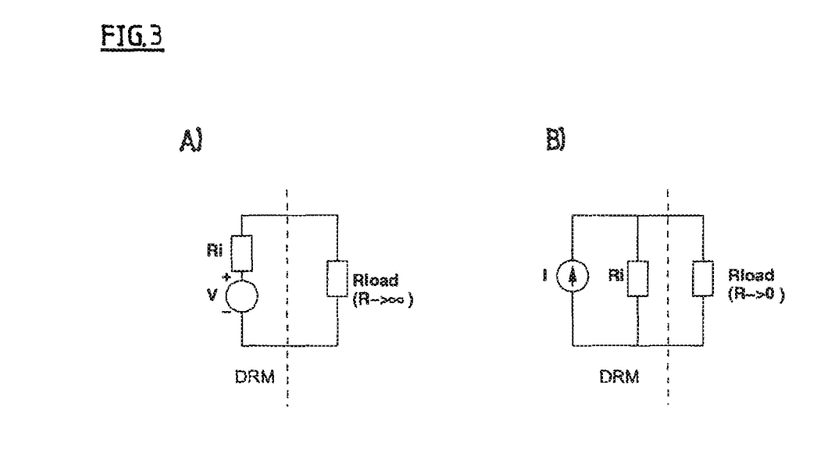

In dependence on the load resistance which is connected to the second end of the line, voltage and current outputs can be provided for reading out the distributed resistive mixer DRM. If as shown in FIG. 3 the output of the line is connected to a high load resistance $R_{load}$ then a voltage output can be embodied at the drain of the last field effect transistor (FETN in FIG. 1b)). If in contrast as diagrammatically shown in FIG. 3b) the end of the line is connected to a low load resistance $R_{load}$ then a current output is implemented at the drain of the last field effect transistor (FETN in FIG. 1b)).

Figure 4:
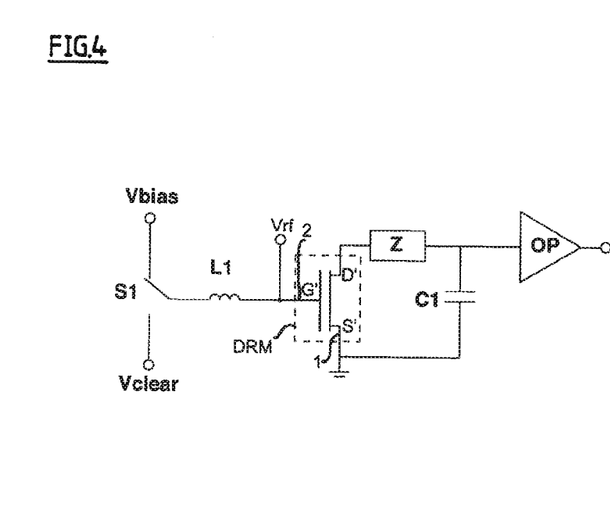
FIG. 4 shows a power detector for electromagnetic high frequency radiation having a resistive mixer according to an embodiment of the invention.
Figure 5:
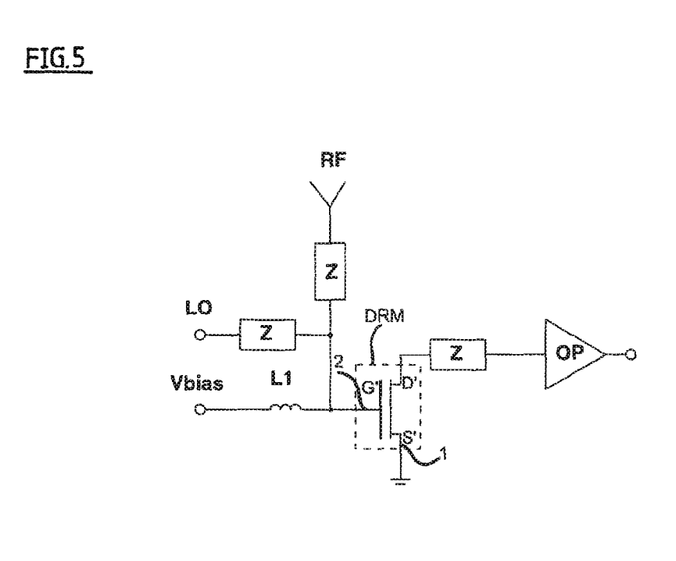
FIG. 5 shows a detector for detecting power and phase of electromagnetic high frequency radiation having a resistive mixer according to an embodiment of the invention.

FIGS. 4 and 5 show the use of a distributed resistive mixer DRM according to the invention for detecting the power of an electromagnetic high frequency signal in the THz frequency range or for mixing the THz signal with a local oscillator signal LO.

FIG. 4 shows an arrangement with which the power of a high frequency signal Vrf which is connected to the conductor 2, that is to say the gates G' of the mixer DRM, is detected. Provided at the drain D' of the last field effect transistor of the mixer DRM is a filter network Z having a low pass characteristic so that only the dc components are integrated by a charge coupled device C1 and detected by way of an electronic read-out arrangement OP. As illustrated hereinbefore that dc component is dependent on the power of the high frequency signal Vrf coupled into the gate G'. The biasing voltage Vbias of the gate can be interrupted and replaced by an erasure voltage by means of a switch S1 so that the detector is reset to zero after exceeding the integration time.

FIG. 5 shows a detector arrangement which is expanded in relation to the embodiment of FIG. 4 and which in addition to the high frequency signal RF ($V_{rf}$ in FIG. 4) a local oscillator signal, for example at a frequency which is reduced in relation to the high frequency signal, is coupled into the gate structure G' of the distributed resistive mixer DRM. In particular the local oscillator signal can be coupled into the gate structure in the form of an electromagnetic wave, preferably by way of an antenna element.

Alternatively the mixer can also be used for detecting the phase position of an intensity modulation impressed on the high frequency signal. For that purpose, as the local oscillator signal, the modulation signal, for example at a frequency of 100 MHz, or a signal coupled to the modulation signal in fixed-phase relationship, is coupled into the gate structure G'. The amplitude of the alternating current of the distributed resistive mixer DRM, that is detected with the electronic read-out arrangement OP, is then dependent on the phase position as between the local oscillator signal LO and the high frequency signal RF.

For the purposes of the original disclosure it is pointed out that all features as can be seen by a man skilled in the art from the present description, the drawings and the claims, even if they are described in specific terms only in connection with certain other features, can be combined both individually and also in any combinations with others of the features or groups of features disclosed here insofar as that has not been expressly excluded or technical aspects make such combinations impossible or meaningless. A comprehensive explicit representation of all conceivable combinations of features is dispensed with here only for the sake of brevity and readability of the description.

While the invention has been illustrated and described in detail in the drawings and the preceding description that illustration and description is only by way of example and is not deemed to be a limitation on the scope of protection as defined by the claims. The invention is not limited to the disclosed embodiments.

Modifications in the disclosed embodiments are apparent to the man skilled in the art from the drawings, the description and the accompanying claims. In the claims the word 'have' does not exclude other elements and the indefinite article 'a' does not exclude a plurality. The mere fact that certain features are claimed in different claims does not exclude the combination thereof. References in the claims are not deemed to be a limitation on the scope of protection.

The invention claimed is:

1. A resistive mixer comprising:
   a transmission line which includes a first and a second electrical conductor each having a respective connecting contact being connectable to a source of an electrical high-frequency signal so that the electrical high frequency signal can be coupled into the transmission line, wherein the first conductor has a plurality of series-connected voltage-dependent resistor elements, whose resistively depend on the voltage locally occurring at the resistor elements, and wherein a capacitive element is arranged between the first and second conductors,
   characterised in that the voltaqe-dependent resistor elements are field effect transistors each having a source (S), a drain (D), a qate (G) and a source-drain channel, wherein the gates of all field effect transistors are so electrically connected together that the gates (G) form the second conductor and wherein the drain of a first field effect transistor is connected to the source of a second field effect transistor so that the source, the source-drain channel and the drain of the first field effect transistor and the source, the source-drain channel and the drain of the second field effect transistor form the first conductor.

2. A resistive mixer as set forth in claim 1 characterised in that the capacitive element is arranged between a first and a second voltage-dependent resistor element.

3. A resistive mixer as set forth in claim 1 or claim 2 characterised in that the voltage-dependent resistor field effect transistors and the capacitor element are integrated in a single semiconductor element on a single substrate.

4. A resistive mixer as set forth in claim 1 characterised in that the individual field effect transistors are produced by structuring of the gate and/or the source-drain channel.

5. A resistive mixer as set forth in claim 1 characterised in that the capacitive element is produced by structuring of the gate and/or the source-drain channel.

6. A resistive mixer as set forth in any one of claims 1 through 2 characterised in that each of the field effect transistors has an effective gate length of less than 250 nm, preferably less than 200 nm.

7. A resistive mixer as set forth in any one of claims 1 through 2 characterised in that the second conductor is connected to a dc voltage source for biasing the gates of the field effect transistors.

8. A resistive mixer as set forth in any one of claims 1 through 2 characterised in that the field effect transistors have negligibly low threshold voltages.

9. A resistive mixer as set forth in any one of claims 1 through 2 characterised in that the first and second conductors are connected at their ends opposite to the connecting contacts to an external matching network.

10. A resistive mixer as set forth in any one of claims 1 through 2 characterised in that the transmission line has at least one further non-linear component, being a matching circuit or a filter network having a low pass characteristic or a diode.

11. A detector for detecting electromagnetic high frequency radiation comprising a resistive mixer as set forth in any one of claims 1 through 2, wherein the transmission line is connected to an antenna element for detecting the high-frequency radiation as a source for an electrical high-frequency signal.

12. A detector as set forth in claim 11 characterised in that the output of the transmission line is connected to a charge coupled device (CCD).

13. A detector as set forth in claim 11 characterised in that the transmission line second electrical conductor is connected to a local oscillator signal source.

* * * * *

UNITED STATES PATENT AND TRADEMARK OFFICE
CERTIFICATE OF CORRECTION

PATENT NO. : 8,547,158 B2  
APPLICATION NO. : 13/063001  
DATED : October 1, 2013  
INVENTOR(S) : Ulrich Pfeiffer et al.

Page 1 of 1

It is certified that error appears in the above-identified patent and that said Letters Patent is hereby corrected as shown below:

In the Claims:

Column 8, line 13, reads "characterised in that the voltaqe-dependent resistor ..."
  should read -- characterised in that the voltage-dependent resistor ... --

Signed and Sealed this
Fourth Day of February, 2014

Michelle K. Lee
*Deputy Director of the United States Patent and Trademark Office*